(12) United States Patent
Iwamoto

(10) Patent No.: US 11,183,453 B2
(45) Date of Patent: Nov. 23, 2021

(54) ELECTRONIC-COMPONENT-EMBEDDED SUBSTRATE HAVING A WIRING LINE WITH A ROUGHENED SURFACE, ELECTRONIC COMPONENT DEVICE, AND COMMUNICATION MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 49 days.

(21) Appl. No.: 16/435,591

(22) Filed: Jun. 10, 2019

(65) Prior Publication Data

US 2019/0295945 A1 Sep. 26, 2019

Related U.S. Application Data

(63) Continuation of application No. PCT/JP2017/043468, filed on Dec. 4, 2017.

(30) Foreign Application Priority Data

Dec. 21, 2016 (JP) .............................. JP2016-248201

(51) Int. Cl.
*H01L 23/522* (2006.01)
*H01L 23/29* (2006.01)
(Continued)

(52) U.S. Cl.
CPC ........ *H01L 23/5226* (2013.01); *H01L 21/561* (2013.01); *H01L 23/293* (2013.01);
(Continued)

(58) Field of Classification Search
CPC ............. H01L 23/5226; H01L 23/5389; H01L 23/5384; H01L 23/49827;
(Continued)

(56) References Cited

U.S. PATENT DOCUMENTS 8,669,653 B2 * 3/2014 Oi ........................... H01L 24/82
257/692
2006/0278967 A1 12/2006 Tuominen et al.
(Continued)

FOREIGN PATENT DOCUMENTS

JP 47-40516 A 10/1972
JP 62-221192 A 9/1987
(Continued)

OTHER PUBLICATIONS

Machine translation of IDS reference JP2005057026 (Mar. 3, 2005).*
(Continued)

*Primary Examiner* — Younes Boulghassoul
(74) *Attorney, Agent, or Firm* — Keating & Bennett, LLP

(57) ABSTRACT

A method of manufacturing an electronic-component-embedded substrate includes forming a power-supplying metal layer on a base, forming through electrodes that are to be connected to the power-supplying metal layer on the power-supplying metal layer by an electrolytic plating method, forming a first wiring line by patterning the power-supplying metal layer, forming an interlayer insulating layer such that the interlayer insulating layer covers a portion of the first wiring line, and forming a second wiring line on at least a portion of the first wiring line and a portion of the interlayer insulating layer such that the second wiring line crosses, on the interlayer insulating layer, a portion of the first wiring line.

20 Claims, 6 Drawing Sheets

(51) Int. Cl.
  *H01L 23/00* (2006.01)
  *H01L 25/065* (2006.01)
  *H01L 25/18* (2006.01)
  *H05K 1/02* (2006.01)
  *H01L 25/07* (2006.01)
  *H01L 23/12* (2006.01)
  *H01L 21/56* (2006.01)

(52) U.S. Cl.
  CPC .............. *H01L 24/05* (2013.01); *H01L 24/16* (2013.01); *H01L 24/96* (2013.01); *H01L 25/065* (2013.01); *H01L 25/0657* (2013.01); *H01L 25/07* (2013.01); *H01L 25/18* (2013.01); *H05K 1/02* (2013.01); *H01L 23/12* (2013.01); *H01L 2224/04105* (2013.01); *H01L 2224/16227* (2013.01); *H01L 2225/06513* (2013.01); *H01L 2924/15311* (2013.01); *H05K 2201/10515* (2013.01)

(58) Field of Classification Search
  CPC ..... H01L 2225/06548; H01L 21/76898; H01L 21/76885; H01L 23/293; H01L 23/3121; H01L 23/3107; H01L 23/145; H01L 21/568; H01L 21/561; H01L 24/96; H01L 25/065; H01L 25/07; H01L 25/0657; H01L 25/18; H01L 25/105; H01L 25/16; H01L 24/05; H01L 24/16; H01L 24/25; H01L 24/24; H01L 2224/04104; H01L 2224/05569; H01L 2224/05008; H01L 2224/0236; H01L 2224/16145; H01L 2224/25175
  See application file for complete search history.

(56) References Cited

U.S. PATENT DOCUMENTS

| | | | |
|---|---|---|---|
| 2009/0039523 A1* | 2/2009 | Jiang | H01L 21/82 257/777 |
| 2016/0205774 A1 | 7/2016 | Chang | |
| 2018/0151546 A1* | 5/2018 | Lin | H01L 25/105 |
| 2019/0109091 A1* | 4/2019 | Somada | H01L 24/19 |
| 2019/0206790 A1* | 7/2019 | Iwamoto | H01L 23/14 |
| 2019/0287951 A1* | 9/2019 | Kim | H01L 21/6835 |
| 2020/0043891 A1* | 2/2020 | Yu | H01L 24/02 |
| 2020/0126898 A1* | 4/2020 | Somada | H01L 21/486 |
| 2021/0203302 A1* | 7/2021 | Iwamoto | H01L 24/02 |

FOREIGN PATENT DOCUMENTS

| | | |
|---|---|---|
| JP | 02-284499 A | 11/1990 |
| JP | 2005-057026 A | 3/2005 |
| JP | 2005-310954 A | 11/2005 |
| JP | 2006-523375 A | 10/2006 |
| JP | 2008-187021 A | 8/2008 |
| JP | 2015-106671 A | 6/2015 |
| JP | 2016-532304 A | 10/2016 |

OTHER PUBLICATIONS

Machine translation of IDS reference JP2015106671 (Jun. 8, 2015).*
Official Communication issued in International Patent Application No. PCT/JP2017/043468, dated Feb. 13, 2018.

* cited by examiner

ELECTRONIC-COMPONENT-EMBEDDED SUBSTRATE HAVING A WIRING LINE WITH A ROUGHENED SURFACE, ELECTRONIC COMPONENT DEVICE, AND COMMUNICATION MODULE

CROSS REFERENCE TO RELATED APPLICATIONS

This application claims the benefit of priority to Japanese Patent Application No. 2016-248201 filed on Dec. 21, 2016 and is a Continuation Application of PCT Application No. PCT/JP2017/043468 filed on Dec. 4, 2017. The entire contents of each application are hereby incorporated herein by reference.

BACKGROUND OF THE INVENTION

1. Field of the Invention

The present invention relates to a method of manufacturing an electronic-component-embedded substrate, an electronic-component-embedded substrate, an electronic component device, and a communication module.

2. Description of the Related Art

In recent years, there has been a demand for a reduction in the area of an electronic component device with a built-in electronic component. In order to achieve a reduction of the area of such an electronic component device, for example, a structure for three-dimensionally arranging wiring lines has been employed (see, for example, Japanese Unexamined Patent Application Publication No. 2005-310954).

The area of an electronic component device that has such a configuration is able to be smaller than the area of an electronic component device in which wiring lines are two-dimensionally arranged.

However, in the case of three-dimensionally arranging wiring lines, there is a problem in that the process of manufacturing the wiring lines becomes complex by, for example, providing an insulating layer between the wiring lines such that the wiring lines will not be short-circuited to each other at a three-dimensionally arranging portion. In addition, for example, when the electronic component device is used in an environment with large temperature changes, in the three-dimensionally arranging portion at which the plurality of wiring lines are three-dimensionally arranged with the insulating layer interposed therebetween, a problem occurs in that the degree of contact between each of the wiring lines and the insulating layer decreases due to thermal stress or the like, so that separation of the wiring lines is likely to occur.

SUMMARY OF THE INVENTION

Preferred embodiments of the present invention provide electronic-component-embedded substrates, electronic component devices, communication modules, and methods of manufacturing the electronic-component-embedded substrates in each of which a process of manufacturing wiring lines is simplified and in which separation of the wiring lines is less likely to occur.

A method of manufacturing an electronic-component-embedded substrate according to a preferred embodiment of the present invention in which an electronic component is embedded includes a power-supplying layer forming step of forming a power-supplying layer on a base, an electrode forming step of forming an electrode that has a predetermined pattern and that is to be connected to the power-supplying layer on the power-supplying layer by an electrolytic plating method, an electronic-component arrangement step of arranging the electronic component above a surface of the power-supplying layer on which the electrode is formed, a sealing step of sealing the electronic component on the power-supplying layer, a first-wiring-line forming step of removing the base and forming a first wiring line by patterning the power-supplying layer, an insulating-layer forming step of forming an insulating layer such that the insulating layer covers a portion of the first wiring line, and a second-wiring-line forming step of forming a second wiring line on at least a portion of the first wiring line and a portion of the insulating layer such that the second wiring line crosses, on the insulating layer, a portion of the first wiring line.

As a result, in the manufacturing method according to the above-described preferred embodiment, the power-supplying layer is patterned (rewired) as the first wiring lines, and thus, the process of manufacturing the electronic-component-embedded substrate is able to be simplified, whereas in the related art, a power-supplying metal layer and first wiring lines are separately provided, and thus, it is necessary to form the first wiring lines after the power-supplying metal layer has been formed and removed. In addition, since the electrode is formed by the electrolytic plating method using the power-supplying layer, the power-supplying layer and the electrode are able to be bonded together with high strength and low resistance. Therefore, the first wiring line, which is formed by patterning the power-supplying layer, and the electrode are less likely to separate from each other, and favorable high-frequency transmission characteristics are able to be obtained. As a result, the electronic-component-embedded substrate in which separation of the wiring line is less likely to occur is able to be provided.

In addition, in the first-wiring-line forming step, the first wiring line may be patterned by wet etching.

As a result, the first wiring line is formed in a forward tapered shape with which the line width of a surface of the first wiring line that is located on the side on which the second wiring line is disposed is larger than the line width of a surface of the first wiring line that is opposite to the surface of the first wiring line that is located on the side on which the second wiring line is disposed. Consequently, the second wiring line that is formed above the first wiring line is formed along the forward tapered shape of the first wiring line so as to be bent at an obtuse angle. Therefore, thermal stress is dispersed in the second wiring line, and thus, breakage of the second wiring line is able to be reduced or prevented. As a result, the electronic-component-embedded substrate in which separation of the wiring line is less likely to occur is able to be provided.

An electronic-component-embedded substrate according to a preferred embodiment of the present invention includes an electronic component, a resin structure in which the electronic component is embedded with a main surface of the electronic component is exposed, a through electrode that extends through two surfaces of the resin structure, a first wiring line that is provided on one of the surfaces of the resin structure and connected to the through electrode, an insulating layer that is disposed at a position at which the insulating layer covers a portion of the first wiring line, and a second wiring line that is provided above the first wiring line and the insulating layer so as to cross at least a portion of the first wiring line. A surface of the first wiring line that is located on the insulating layer side is roughened.

As a result, the degree of contact between the first wiring line and the insulating layer is improved, and thus, separation of the first wiring line and the insulating layer from each other is able to be reduced or prevented. Therefore, the electronic-component-embedded substrate in which separation of the wiring line is less likely to occur is able to be provided.

The second wiring line may have a ductility higher than a ductility of the first wiring line.

As a result, in the case in which the second wiring line is made of a ductile material, the second wiring line is less likely to break even if thermal stress is repeatedly applied thereto, and thus, separation of the second wiring line from the resin structure or from the interlayer insulating layer due to differences between the thermal expansion coefficients of the second wiring line, the resin structure, and the interlayer insulating layer is able to be reduced or prevented. Therefore, the electronic-component-embedded substrate in which separation of the wiring line is less likely to occur is able to be provided.

In addition, an angle of a side surface of the first wiring line with respect to the surface of the resin structure that is in contact with the first wiring line may be an angle at which a line width of a surface of the first wiring line that is located on the resin structure side is larger than a line width of the surface of the first wiring line that is located on the insulating layer side.

As a result, the area of the first wiring line that is in close contact with the insulating layer increases, and the degree of contact between the first wiring line and the insulating layer is improved, so that separation of the first wiring line and the insulating layer from each other is able to be reduced or prevented. Therefore, the electronic-component-embedded substrate in which separation of the wiring line is less likely to occur is able to be provided.

In addition, in at least one position at which the first wiring line and the second wiring line cross each other, cross-sectional shapes of the first wiring line and the second wiring line in a line-width direction may be shapes with which a ratio of a difference between the line width of the surface of the first wiring line that is located on the resin structure side and the line width of the surface of the first wiring line that is located on the insulating layer side to a thickness of the first wiring line is larger than a ratio of a difference between the line width of a surface of the second wiring line that is located on the resin structure side and the line width of a surface of the second wiring line that is located on the insulating layer side to a thickness of the second wiring line.

As a result, thermal stress is dispersed in the second wiring line, and thus, breakage of the second wiring line is able to be reduced or prevented. Therefore, the electronic-component-embedded substrate in which separation of the wiring line is less likely to occur is able to be provided.

In addition, the surface of the first wiring line that is located on the insulating layer side may be roughened more than the surface of the first wiring line that is located on the resin structure side.

As a result, the degree of contact between the first wiring line and the insulating layer is able to be improved, and in addition, the degree of contact between the first wiring line and the resin structure is able to be improved. Therefore, the electronic-component-embedded substrate in which separation of the wiring line is further less likely to occur is able to be provided.

An electronic component device according to a preferred embodiment of the present invention includes a mounting substrate, an electronic-component-embedded substrate that is mounted on the mounting substrate and that has the above-described features, and a mounting component that is mounted on the electronic-component-embedded substrate.

As a result, the electronic component device that includes the electronic-component-embedded substrate having the above-described features and in which separation of a wiring line is less likely to occur is able to be provided.

In addition, the electronic component device may include a plurality of the electronic-component-embedded substrates, and the plurality of electronic-component-embedded substrates may be laminated together between the mounting substrate and the mounting component.

As a result, the electronic component device in which separation of the wiring line is further less likely to occur and in which the plurality of electronic-component-embedded substrates are laminated together is able to be provided.

A communication module according to a preferred embodiment of the present invention includes an electronic component device that has the above-described features as a high-frequency device.

As a result, a high-frequency communication module that includes, as a high-frequency device, the electronic component device that having the above-described features and in which separation of a wiring line is less likely to occur is able to be provided.

According to preferred embodiments of the present invention, electronic-component-embedded substrates, electronic component devices, communication modules, and methods of manufacturing the electronic-component-embedded substrates in each of which a process of manufacturing wiring lines is simplified and in which separation of the wiring lines is less likely to occur are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
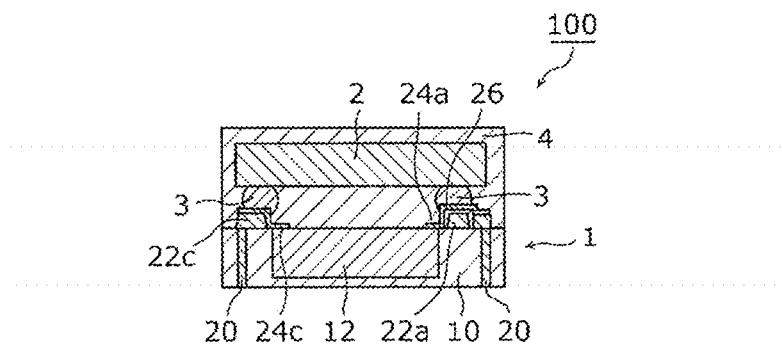
FIG. 1 is a sectional view illustrating an example of an electronic component device according to a first preferred embodiment of the present invention.

Preferred embodiments of the present invention will be described in detail below with reference to the accompanying drawings. Note that the preferred embodiments, which will be described below, are comprehensive or specific examples. Numerical values, shapes, materials, components, arrangement positions and connection configurations of the components, and other elements and features that are described in the following preferred embodiments are examples and are not intended to limit the scope of the present invention. Among the components in the following preferred embodiments, the components that are not described in the independent claims will be described as arbitrary or optional components. In addition, the sizes of the components illustrated in the drawings or the ratio of the sizes are not necessarily exact.

First Preferred Embodiment

An electronic-component-embedded substrate 1 and an electronic component device 100 according to the first preferred embodiment are included in, for example, a communication module or other suitable device that is used to transmit and receive high-frequency signals.

The configuration of the electronic component device 100 according to the present preferred embodiment will be described first. FIG. 1 is a schematic sectional view illustrating the configuration of the electronic component device 100 according to the present preferred embodiment.

As illustrated in FIG. 1, the electronic component device 100 includes the electronic-component-embedded substrate 1 and a mounting component 2. The mounting component 2 is connected to at least one of first wiring lines 22a, 22b, and 22c and second wiring lines 24a, 24b, 24c, 24d, and 24e, which are provided on a surface of the electronic-component-embedded substrate 1, via at least one of bumps 3. In addition, the mounting component 2 is sealed on the electronic-component-embedded substrate 1 by a sealing layer 4.

The electronic-component-embedded substrate 1 is a substrate in which electronic components 12 and 14 (see FIGS. 2A and 2B) are embedded in a resin structure 10. The first wiring lines 22a, 22b, and 22c and the second wiring lines 24a, 24b, 24c, 24d, and 24e (see FIGS. 2A and 2B) are provided on a first main surface of the electronic-component-embedded substrate 1. The first wiring lines 22a, 22b, and 22c and the second wiring lines 24a, 24b, 24c, 24d, and 24e are, for example, wiring lines that electrically connect the electronic components 12 and 14 to each other. The configuration of the electronic-component-embedded substrate 1 will be described in detail below.

The mounting component 2 is preferably, for example, a high-frequency circuit component, such as a filter, or an electronic component, such as an inductor or a capacitor. More specifically, as a high-frequency circuit component, an electronic component such as an acoustic wave filter, a piezoelectric resonator, or a multilayer capacitor may be used. A module component may be used as the mounting component 2. Alternatively, the mounting component 2 may be a mounting substrate.

Figure 2A:
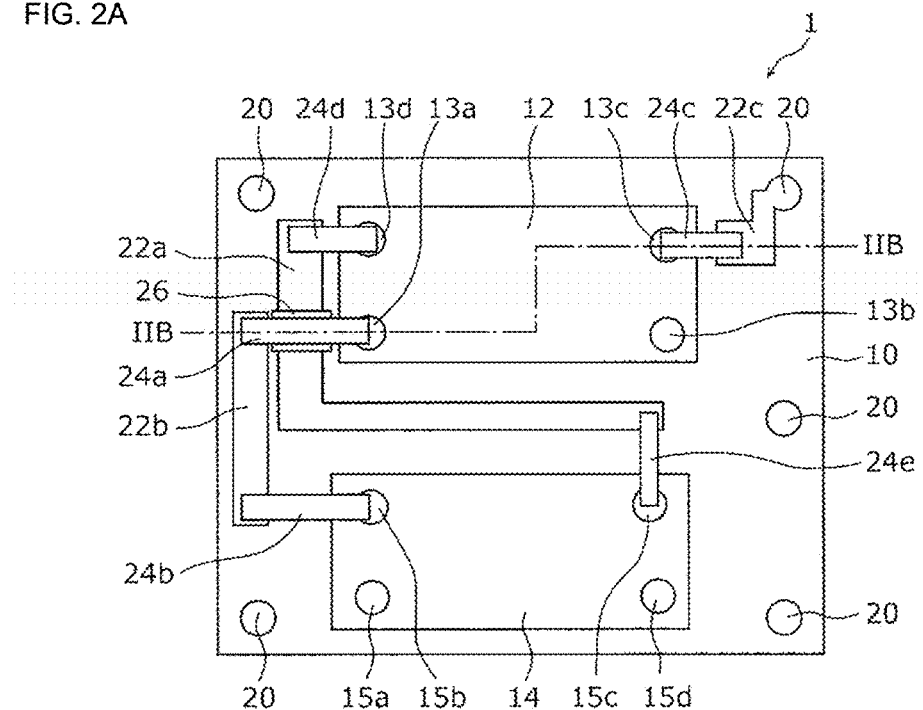
FIG. 2A is a plan view illustrating a configuration of an electronic-component-embedded substrate according to the first preferred embodiment of the present invention.
Figure 2B:
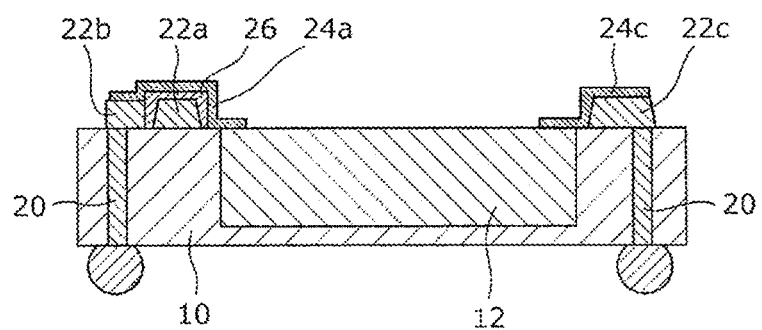
FIG. 2B is a sectional view of the electronic-component-embedded substrate taken along line IIB-IIB of FIG. 2A.

The configuration of the electronic-component-embedded substrate 1 will now be described. FIG. 2A is a plan view illustrating the configuration of the electronic-component-embedded substrate 1 according to the present preferred embodiment. FIG. 2B is a sectional view of the electronic-component-embedded substrate 1 taken along line IIB-IIB of FIG. 2A.

As illustrated in FIGS. 2A and 2B, the electronic-component-embedded substrate 1 includes the resin structure 10, the electronic components 12 and 14, through electrodes 20, the first wiring lines 22a, 22b, and 22c, the second wiring lines 24a, 24b, 24c, 24d, and 24e, and an interlayer insulating layer 26. The electronic components 12 and 14 are embedded in the resin structure 10 while a main surface of each of the electronic components 12 and 14 is exposed. The through electrodes 20 extend through the two surfaces of the resin structure 10. The first wiring lines 22a, 22b, and 22c are provided on a surface of the resin structure 10 and connected to the through electrodes 20. The interlayer insulating layer 26 is disposed at a position at which the interlayer insulating layer 26 covers a portion of the first wiring lines 22*a*, 22*b*, and 22*c*. The second wiring lines 24*a*, 24*b*, 24*c*, 24*d*, and 24*e* are provided above the first wiring lines 22*a*, 22*b*, and 22*c* and the interlayer insulating layer 26 so as to cross at least portions of the first wiring lines 22*a*, 22*b*, and 22*c*. In addition, a surface of the first wiring lines 22*a*, 22*b*, and 22*c* that is to be in contact with the interlayer insulating layer 26 is roughened.

Specifically, the resin structure 10 is preferably made of, for example, a resin material, such as a synthetic resin. As the synthetic resin, an epoxy resin, an acrylic resin, or other suitable resin may be used. Preferably, a resin material obtained by adding an inorganic filler, such as silica or alumina, for example, to a synthetic resin such as an epoxy resin, may be used. By adding an inorganic filler, a sealing property of the resin structure 10 with respect to the electronic components 12 and 14 (described later) is able to be improved. In addition, the rigidity of the resin structure 10 is able to be improved. Furthermore, the degree of shrinkage of the resin structure 10 at the time of being cured is reduced, so that the sealing accuracy is able to be improved.

Note that the surface of the resin structure 10 at which the electronic components 12 and 14 are exposed will be referred to as the first main surface, and a surface of the resin structure 10 that is opposite to the first main surface will be referred to as a second main surface.

The electronic components 12 and 14 are embedded in the resin structure 10. The electronic components 12 and 14 are preferably, for example, high-frequency circuit components, such as filters, or electronic components, such as inductors or capacitors. More specifically, as high-frequency circuit components, electronic components, such as acoustic wave filters, piezoelectric resonators, and multilayer capacitors may be used. For example, the electronic components 12 and 14 may be acoustic wave filter devices in each of which a plurality of IDT electrodes are provided on a piezoelectric single crystal, such as $LiTaO_3$ or $LiNbO_3$, or a piezoelectric ceramic.

Note that the main surface of each of the electronic components 12 and 14 that is exposed through the resin structure 10 will be referred to as a top surface, and the other main surface of each of the electronic components 12 and 14 that is opposite to the corresponding top surface will be referred to as a bottom surface.

As illustrated in FIGS. 2A and 2B, the top surfaces of the electronic components 12 and 14 are exposed at the first main surface of the resin structure 10, and the bottom surfaces and side surfaces of the electronic components 12 and 14 are sealed by the resin material of the resin structure 10. Here, the top surfaces of the electronic components 12 and 14 may be flush with the first main surface of the resin structure 10.

In addition, as illustrated in FIG. 2A, the electronic component 12 includes a plurality of connection terminals 13*a* to 13*d* that electrically connect the electronic component 12 to the outside, and the electronic component 14 includes a plurality of connection terminals 15*a* to 15*d* that electrically connect the electronic component 14 to the outside. The electronic components 12 and 14 are connected to external devices, other electronic components, or other devices by, for example, wiring lines via the connection terminals 13*a* to 13*d* and 15*a* to 15*d*, so that the electronic components 12 and 14 input and output signals to and from the external devices, the other electronic components, or other devices.

The through electrodes 20 are provided in the resin structure 10 so as to extend through the two surfaces of the resin structure 10. Each of the through electrodes 20 is made of a metal or an alloy. For example, each of the through electrodes 20 may preferably be made of copper. In addition, the through electrodes 20 may be made of the same material as the first wiring lines 22*a*, 22*b*, and 22*c*. An end of each of the through electrodes 20 is connected to one of the first wiring lines 22*a*, 22*b*, and 22*c*.

Each of the first wiring lines 22*a*, 22*b*, and 22*c* is provided on the first main surface of the resin structure 10 preferably using, for example, copper foil. In this case, the first wiring lines 22*a*, 22*b*, and 22*c* are not connected to the electronic components 12 and 14. In addition, the interlayer insulating layer 26 is provided on at least a portion of the first wiring line 22*a*.

As illustrated in FIGS. 2A and 2B, the interlayer insulating layer 26 is provided on the first wiring line 22*a* and the resin structure 10 so as to cover a portion of the first wiring line 22*a*. As will be described below, this portion is a portion at which the first wiring line 22*a* and the second wiring line 24*a* three-dimensionally cross each other. Note that the interlayer insulating layer 26 may cover not only the first wiring line 22*a* but also a portion of the first wiring line 22*b* and a portion of the first wiring line 22*c*. The interlayer insulating layer 26 is preferably made of, for example, a resin such as a polyimide resin, a benzocyclobutene resin, a polybenzoxazole resin, a phenolic resin, a silicone-based resin, or other suitable resin. Note that the interlayer insulating layer 26 is not limited to being made of one of the above-described resins and may be made of a different resin or a material having an insulating property.

The second wiring lines 24*a*, 24*b*, 24*c*, 24*d*, and 24*e* are provided on the resin structure 10. Each of the second wiring lines 24*a*, 24*b*, 24*c*, 24*d*, and 24*e* is preferably made of, for example, copper foil. Each of the second wiring lines 24*a*, 24*b*, 24*c*, 24*d*, and 24*e* may be made of a material having a ductility higher than that of the material of the first wiring lines 22*a*, 22*b*, and 22*c*. In the case in which the second wiring lines 24*a*, 24*b*, 24*c*, 24*d*, and 24*e* are made of a ductile material, the second wiring lines 24*a*, 24*b*, 24*c*, 24*d*, and 24*e* are less likely to break even if thermal stress is repeatedly applied thereto, and thus, separation of the second wiring lines 24*a*, 24*b*, 24*c*, 24*d*, and 24*e* from the resin structure 10 or from the interlayer insulating layer 26 due to differences between the thermal expansion coefficients of the second wiring lines 24*a*, 24*b*, 24*c*, 24*d*, and 24*e*, the resin structure 10, and the interlayer insulating layer 26 is able to be reduced or prevented.

As illustrated in FIGS. 2A and 2B, the second wiring line 24*a* is provided on the surface of the resin structure 10 so as to cover a portion of the interlayer insulating layer 26. More specifically, as illustrated in FIGS. 2A and 2B, the second wiring line 24*a* extends over a portion of the interlayer insulating layer 26 from the connection terminal 13*a* of the electronic component 12 to the first wiring line 22*b* when viewed in plan view. As a result, the second wiring line 24*a* covers the portion of the first wiring line 22*a* overlapping the interlayer insulating layer 26. In addition, the second wiring line 24*a* is electrically connected to the connection terminal 13*a* of the electronic component 12 and the first wiring line 22*b*. Thus, the electronic component 12 is electrically connected to the first wiring line 22*b* via the connection terminal 13*a* and the second wiring line 24*a*.

The second wiring line 24*b* extends from the connection terminal 15*b* of the electronic component 14 to the resin structure 10 and the first wiring line 22*b*. As a result, the electronic component 14 is electrically connected to the first wiring line 22*b* via the connection terminal 15*b* and the second wiring line 24*b*.

Similarly, the second wiring line 24c extends from the connection terminal 13c of the electronic component 12 to the resin structure 10 and the first wiring line 22c. As a result, the electronic component 12 is electrically connected to the first wiring line 22c via the connection terminal 13c and the second wiring line 24c. Note that the first wiring line 22c is connected to one of the through electrodes 20.

The second wiring line 24d extends from the connection terminal 13d of the electronic component 12 to the resin structure 10 and the first wiring line 22a. As a result, the electronic component 12 is electrically connected to the first wiring line 22a via the connection terminal 13d and the second wiring line 24d.

The second wiring line 24e extends from the connection terminal 15c of the electronic component 14 to the resin structure 10 and the first wiring line 22a. As a result, the electronic component 14 is electrically connected to the first wiring line 22a via the connection terminal 15c and the second wiring line 24e.

The portion at which the first wiring line 22a and the second wiring line 24a three-dimensionally cross each other will now be described. As illustrated in FIGS. 2A and 2B, in the portion at which the first wiring line 22a and the second wiring line 24a three-dimensionally cross each other, the interlayer insulating layer 26 is disposed between the first wiring line 22a and the second wiring line 24a. As a result, the first wiring line 22a and the second wiring line 24a are insulated from each other, and thus, the first wiring line 22a and the second wiring line 24a are able to transmit different electrical signals without being short-circuited.

Figure 3A:
FIG. 3A is a schematic cross-sectional view illustrating the cross-sectional shape of a first wiring line of the electronic-component-embedded substrate according to the first preferred embodiment of the present invention in a width direction of the first wiring line.
Figure 3B:
FIG. 3B is a schematic cross-sectional view illustrating the cross-sectional shape of a second wiring line of the electronic-component-embedded substrate according to the first preferred embodiment of the present invention in a width direction of the second wiring line.

FIG. 3A is a schematic cross-sectional view illustrating the cross-sectional shape of the first wiring line 22a in a width direction of the first wiring line 22a. FIG. 3B is a schematic cross-sectional view illustrating the cross-sectional shape of the second wiring line 24a in a width direction of the second wiring line 24a.

The surface of the first wiring line 22a that is to be in contact with the interlayer insulating layer 26 is roughened. Note that the term "being roughened" refers to increasing the arithmetic mean roughness Ra of a surface of a wiring line, a substrate, or other structure. By roughening the surface of the first wiring line 22a, the contact surface area between the wiring material and the interlayer insulating layer 26 is increased, and the degree of contact between the wiring material and the interlayer insulating layer 26 is improved by an anchor effect, so that the degree of contact between the first wiring line 22a and the interlayer insulating layer 26 is improved. Thus, separation of the first wiring line 22a and the interlayer insulating layer 26 from each other is able to be reduced or prevented.

The first wiring line 22a has a tapered cross-sectional shape when the first wiring line 22a is cut in the width direction. In other words, the angle of each of the side surfaces of the first wiring line 22a with respect to the surface of the resin structure 10 that is in contact with the first wiring line 22a, is set to an angle at which the line width of the surface of the first wiring line 22a that is located on the side on which the resin structure 10 is provided is larger than the line width the surface of the first wiring line 22a that is located on the side on which the interlayer insulating layer 26 is provided. More specifically, as illustrated in FIG. 3A, the side surfaces of the first wiring line 22a are inclined with respect to the resin structure 10 such that the line width of the surface of the first wiring line 22a that is located on the side on which the resin structure 10 is provided is larger than the line width the surface of the first wiring line 22a that is located on the side on which the interlayer insulating layer 26 is provided. In addition, as illustrated in FIG. 3B, the side surfaces of the second wiring line 24a are perpendicular or substantially perpendicular to the resin structure 10.

As will be described below, for example, the wiring pattern of the first wiring line 22a is preferably formed by a wet etching method, and the wiring pattern of the second wiring line 24a is preferably formed by a semi-additive method (an electrolytic plating method). Thus, the angle of each of the side surfaces of the first wiring line 22a with respect to the first main surface of the resin structure 10 is set to be larger than the angle of each of the side surfaces of the second wiring line 24a with respect to the first main surface of the resin structure 10.

In addition, the cross-sectional shapes of the first wiring line 22a and the second wiring line 24a in at least one position at which the first wiring line 22a and the second wiring line 24a cross each other are set such that the ratio of the difference between the line width (the length in the width direction) of the first wiring line 22a on the side on which the resin structure 10 is provided and the line width of the first wiring line 22a on the side on which the interlayer insulating layer 26 is provided to the thickness of the first wiring line 22a is larger than the ratio of the difference between the line width of the second wiring line 24a on the side on which the resin structure 10 is provided and the line width of the second wiring line 24a on the side on which the interlayer insulating layer 26 is provided to the thickness of the second wiring line 24a. In other words, when $T1 =$ (line width of first wiring line on resin layer side−line width of first wiring line on insulating layer side)/(thickness of first wiring line), and $T2 =$ (line width of second wiring line on resin layer side−line width of second wiring line on insulating layer side)/(thickness of second wiring line), the cross-sectional shapes of the first wiring line 22a and the second wiring line 24a are formed so as to satisfy a relationship of $T1 > T2$.

As a result, the area of the first wiring line 22a that is brought into close contact with the interlayer insulating layer 26 is increased, and the degree of contact between the first wiring line 22a and the interlayer insulating layer 26 is improved, so that separation of the first wiring line 22a and the interlayer insulating layer 26 from each other is able to be reduced or prevented.

Note that the cross-sectional shapes of the first wiring lines 22b and 22c in the width direction are each similar to that of the first wiring line 22a. In addition, the cross-sectional shapes of the second wiring lines 24b, 24c, 24d, and 24e in the width direction are each similar to that of the second wiring line 24a.

Figure 4A:
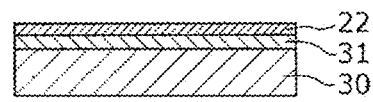
FIG. 4A is a sectional view illustrating a process of manufacturing the electronic component device according to the first preferred embodiment of the present invention.

A non-limiting example of a method of manufacturing the electronic-component-embedded substrate 1 and the electronic component device 100 will now be described. FIGS. 4A to 4N are sectional views illustrating a process of manufacturing the electronic-component-embedded substrate 1 and the electronic component device 100 according to the present preferred embodiment. In the following manufacturing method, a plurality of electronic component devices 100 are simultaneously formed on the same resin structure 10 and then are singulated, so that the individual electronic component devices 100 are completed. However, FIGS. 4A to 4N illustrate only one of the electronic component devices 100 for ease of understanding each manufacturing step.

First, as illustrated in FIG. 4A, a support member is prepared. As illustrated in FIG. 4A, the support member includes a base plate 30 and a bonding layer 31 that is provided on the base plate 30. The base plate 30 is preferably made of, for example, a glass epoxy material. The bonding layer 31 is preferably made of, for example, an acrylic adhesive material. Note that the base plate 30 is not limited to being made of a glass epoxy material and may be made of, SUS, a PET film, a PEN film, a polyimide film, or other suitable film. The bonding layer 31 is not limited to being made of an acrylic adhesive material and may be made of a nickel layer or other suitable layer.

A power-supplying metal layer 22 is formed on the bonding layer 31 (a power-supplying layer forming step). The power-supplying metal layer 22 is a metal layer that defines and functions as the first wiring lines 22a, 22b, and 22c in a subsequent step. The thickness of the power-supplying metal layer 22 is preferably, for example, about 5 µm to about 20 µm. The power-supplying metal layer 22 is bonded to the base plate 30 by the bonding layer 31.

Here, a rolled material that has low ductility and that is hard may be used as the material of the power-supplying metal layer 22. As a result, deformation that occurs in the power-supplying metal layer 22 due to thermal stress from the resin structure 10 is small, and thus, when the power-supplying metal layer 22 is formed as the first wiring lines 22a, 22b, and 22c at a later time, transmission of the thermal stress from the resin structure 10 to the first wiring lines 22a, 22b, and 22c at the portions at which the first wiring lines 22a, 22b, and 22c cross the second wiring lines 24a, 24b, 24c, 24d, and 24e is able to be reduced or prevented.

In addition, a surface of the power-supplying metal layer 22, which is to be patterned so as to form the first wiring lines 22a, 22b, and 22c in a subsequent step, the surface being located on the side on which the base plate 30 is provided, is roughened. The surface of the power-supplying metal layer 22 that is located on the side on which the base plate 30 is provided is a surface onto which the interlayer insulating layer 26 is formed in a subsequent step. In other words, the surface of the power-supplying metal layer 22 that is opposite to a surface of the power-supplying metal layer 22 that is located on the side on which the resin structure 10 is provided is roughened. For example, the surface of the power-supplying metal layer 22 is roughened by performing a surface treatment using an etching roughening agent thereon. By roughening the surface of the first wiring line 22a, the contact surface area between the wiring material and the interlayer insulating layer 26 is increased, and the degree of contact between the wiring material and the interlayer insulating layer 26 is improved by an anchor effect.

Note that the power-supplying metal layer 22 may be made using a material having a large surface roughness. For example, a Cu foil member having two surfaces both of which has a large surface roughness may be used as the power-supplying metal layer 22. More specifically, the surface roughness of the surface of the power-supplying metal layer 22 that is located on the side on which the base plate 30 is provided may be set to be larger than the surface roughness of the surface of the power-supplying metal layer 22 that is opposite to the surface roughness of the surface of the power-supplying metal layer 22 that is located on the side on which the base plate 30 is provided.

Figure 4B:
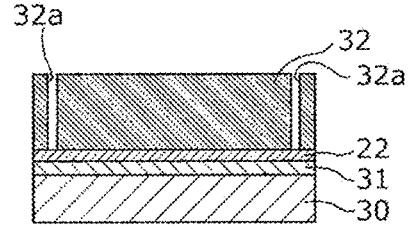
FIG. 4B is a sectional view illustrating the process of manufacturing the electronic component device according to the first preferred embodiment of the present invention.

Next, as illustrated in FIG. 4B, a resist 32 is disposed on a multilayer body that is formed of the base plate 30, the bonding layer 31, and the power-supplying metal layer 22. In addition, cavities 32a that are used to form the through electrodes 20 are formed at desired positions in the resist 32.

Then, the through electrodes 20 are formed in the cavities 32a of the resist 32 while using the power-supplying metal layer 22 as a power-supplying film (an electrode forming step). Regarding the formation of the through electrodes 20, for example, in order to reduce the interface resistance between the power-supplying metal layer 22 and the through electrodes 20, the through electrodes 20 are preferably formed by an electrolytic plating method using a material that is the same as the metal material of the power-supplying metal layer 22. For example, when a copper foil member is used as the power-supplying metal layer 22, the through electrodes 20 may be formed by an electrolytic plating method using copper. As a result, recrystallization occurs at the interface between the power-supplying metal layer 22 and each of the through electrodes 20 in a heat application step, which is subsequently performed, and thus, the first wiring lines 22a, 22b, and 22c formed by patterning the power-supplying metal layer 22 and the through electrodes 20 are able to be bonded together with high strength and low resistance. Thus, the first wiring lines 22a, 22b, and 22c and the through electrodes 20 are less likely to separate from one another, and favorable high-frequency transmission characteristics are able to be obtained.

Figure 4C:
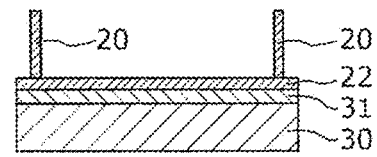
FIG. 4C is a sectional view illustrating the process of manufacturing the electronic component device according to the first preferred embodiment of the present invention.

After the through electrodes 20 have been formed, the resist 32 is removed. The resist 32 is preferably removed by, for example, melting the resist 32 with a chemical solvent. As a result, as illustrated in FIG. 4C, a configuration in which the through electrodes 20 are bonded to portions of the power-supplying metal layer 22 is obtained.

Subsequently, a temporary fixing member 33 that is used to temporarily fix the electronic component 12 on the power-supplying metal layer 22 is disposed on the surface of the power-supplying metal layer 22 on which the through electrodes 20 have been formed. The temporary fixing member 33 is disposed at a desired position at which the electronic component 12 is to be disposed. The temporary fixing member 33 is preferably, for example, an adhesive sheet.

Figure 4D:
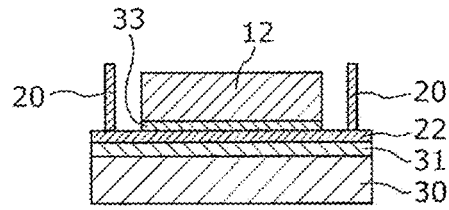
FIG. 4D is a sectional view illustrating the process of manufacturing the electronic component device according to the first preferred embodiment of the present invention.

Then, as illustrated in FIG. 4D, the electronic component 12 is disposed on the temporary fixing member 33 (an electronic-component arrangement step). As a result, the electronic component 12 is temporarily fixed to a position above the surface of the power-supplying metal layer 22, on which the through electrodes 20 have been formed, via the temporary fixing member 33.

Figure 4E:
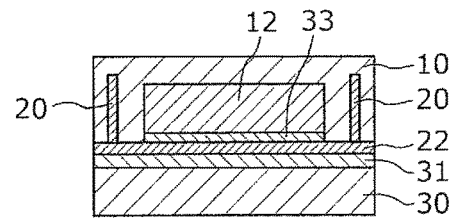
FIG. 4E is a sectional view illustrating the process of manufacturing the electronic component device according to the first preferred embodiment of the present invention.

Next, as illustrated in FIG. 4E, a resin structural member that forms the resin structure 10 is disposed such that the electronic component 12 and the through electrodes 20 are embedded in the resin structural member, and the resin structural member is cured by applying heat thereto (a sealing step). As a result, the resin structure 10 in which the electronic component 12 and the through electrodes 20 are embedded (sealed) is formed. In this case, it is preferable to select, as the resin structural member, a material that exhibits high adhesion strength with respect to the electronic component 12 after being cured. For example, a material that includes a mixture of an epoxy resin and a silica filler as a main material is preferably used.

In order to improve the bonding strength among the resin structure 10, the electronic component 12, the through electrodes 20, and the power-supplying metal layer 22, a step of cleaning the electronic component 12, the through electrodes 20, and the power-supplying metal layer 22 is performed before the resin structure 10 is formed. For example, an oxygen plasma asking treatment may be used as the cleaning step. In the case in which irregularities have been formed on the surface of the power-supplying metal layer (the surface roughness of the surface of the power-supplying metal layer 22 is large), the degree of contact between the power-supplying metal layer 22 and the resin structure 10 is increased by an anchor effect to be larger than that in the case in which irregularities are not formed on the surface of the power-supplying metal layer 22. The anchor effect improves the degree of contact between a material surface and an adhesive as a result of the adhesive fitting, like tree roots, into fine projections and depressions on the material surface and then being cured. In other words, in the case of the power-supplying metal layer 22 including the surface on which projections and depressions are formed, the resin structural member, which forms the resin structure 10, fits into these projections and depressions and then is cured, so that the degree of contact between the power-supplying metal layer 22 and the resin structure 10 is improved.

Figure 4F:
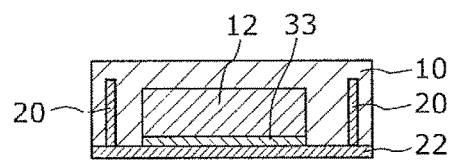
FIG. 4F is a sectional view illustrating the process of manufacturing the electronic component device according to the first preferred embodiment of the present invention.

Next, as illustrated in FIG. 4F, the support member, which includes the base plate 30 and the bonding layer 31, is removed while the power-supplying metal layer 22 is left behind. The support member is removed by separating the bonding layer 31 and the base plate 30 from the power-supplying metal layer 22.

Figure 4G:
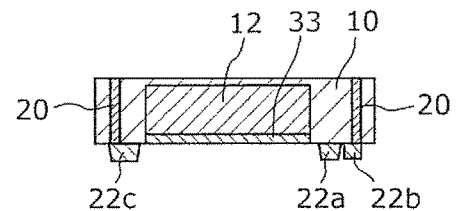
FIG. 4G is a sectional view illustrating the process of manufacturing the electronic component device according to the first preferred embodiment of the present invention.

Thereafter, a wiring-pattern resist is formed on the power-supplying metal layer 22. In this case, it is preferable that the wiring-pattern resist is formed such that the portions in which the through electrodes 20 and the power-supplying metal layer 22 are connected to one another are left behind as the first wiring lines 22a, 22b, and 22c. Subsequently, as illustrated in FIG. 4G, the first wiring lines 22a, 22b, and 22c are formed by patterning (a first-wiring-line forming step). In this case, etching is performed on the power-supplying metal layer 22 such that each of the first wiring lines 22a, 22b, and 22c has a forward tapered shape. For example, wet etching is preferably used as the etching method. As a result, the angle of each of the side surfaces of the first wiring line 22a with respect to the first main surface of the resin structure 10 is able to be larger than the angle of each of the side surfaces of the second wiring line 24a with respect to the first main surface of the resin structure 10.

Thereafter, the wiring-pattern resist is removed, and as illustrated in FIG. 4G, the patterning of the first wiring lines 22a, 22b, and 22c is completed.

As described above, since the first wiring lines 22a, 22b, and 22c are formed by patterning the power-supplying metal layer 22, the process of manufacturing the electronic-component-embedded substrate 1 is able to be simplified. In other words, in the related art, a power-supplying metal layer and first wiring lines are separately provided, and thus, it is necessary to form the first wiring lines after the power-supplying metal layer has been formed and removed. However, in the manufacturing method according to the present preferred embodiment, the power-supplying metal layer 22 is patterned (rewired) as the first wiring lines 22a, 22b, and 22c, and thus, the process of manufacturing the electronic-component-embedded substrate 1 is able to be simplified.

Figure 4H:
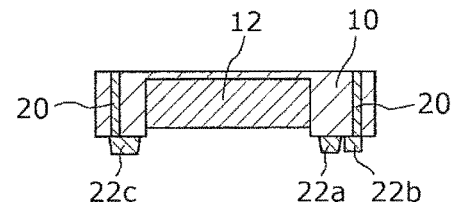
FIG. 4H is a sectional view illustrating the process of manufacturing the electronic component device according to the first preferred embodiment of the present invention.

Next, the temporary fixing member 33, which has been used to temporarily fix the electronic component 12 to the support member, is separated from the electronic component 12 and removed. As a result, as illustrated in FIG. 4H, the top surface of the electronic component 12 is exposed at the first main surface of the resin structure 10.

Figure 4I:
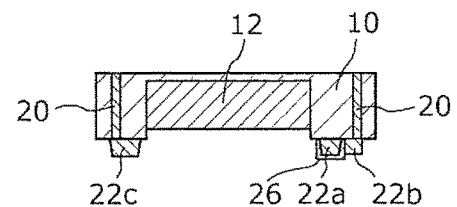
FIG. 4I is a sectional view illustrating the process of manufacturing the electronic component device according to the first preferred embodiment of the present invention.

Then, as illustrated in FIG. 4I, the interlayer insulating layer 26 is formed on the resin structure 10 and the first wiring lines 22a, 22b, and 22c so as to cover at least a portion of the first wiring lines 22a, 22b, and 22c (an insulating-layer forming step). As a material of the interlayer insulating layer 26, a resin such as a polyimide resin, a benzocyclobutene resin, a polybenzoxazole resin, a phenolic resin, a silicone-based resin, or other suitable resin, for example, may preferably be used. At least one of these materials is applied so as to cover portions of the first wiring lines 22a, 22b, and 22c that cross the second wiring lines 24a, 24b, 24c, 24d, and 24e, which will be formed in a subsequent step, and then is cured, so that the interlayer insulating layer 26 is formed. The thickness of the interlayer insulating layer 26 is preferably, for example, about 5 μm.

Figure 4J:
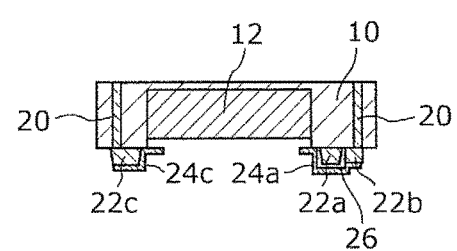
FIG. 4J is a sectional view illustrating the process of manufacturing the electronic component device according to the first preferred embodiment of the present invention.

Next, as illustrated in FIG. 4J, the second wiring lines 24a, 24b, 24c, 24d, and 24e are formed (a second-wiring-line forming step). For example, a semi-additive method is preferably used as the method of forming the second wiring lines 24a, 24b, 24c, 24d, and 24e. As a result, the angle of each of the side surfaces of the second wiring lines 24a, 24b, 24c, 24d, and 24e to the first main surface of the resin structure 10 is set to be smaller than the angle of each of the side surfaces of the first wiring lines 22a, 22b, and 22c with respect to the first main surface of the resin structure 10. The thickness of each of the second wiring lines 24a, 24b, 24c, 24d, and 24e is preferably, for example, about 5 μm to about 10 μm.

Each of the second wiring lines 24a, 24b, 24c, 24d, and 24e formed by the semi-additive method is a fine wiring line preferably having an L/S of about 1 μm, for example, and is a high-aspect wiring line having an aspect ratio of about 10 (e.g., the line width is about 1 μm, and the thickness is about 10 μm). As described above, since the second wiring lines 24a, 24b, 24c, 24d, and 24e are fine and high-aspect wiring lines, the second wiring lines 24a, 24b, 24c, 24d, and 24e have low electrical resistance while being fine wiring lines. As described above, since the second wiring lines 24a, 24b, 24c, 24d, and 24e are fine and high aspect wiring lines, the second wiring lines 24a, 24b, 24c, 24d, and 24e have low electrical resistance while being fine wiring lines. Note that the second wiring lines 24a, 24b, 24c, 24d, and 24e may be formed by a different method, such as sputtering, for example.

Note that, in the case in which the cross-sectional shape of each of the first wiring lines 22a, 22b, and 22c, which are formed below the second wiring lines 24a, 24b, 24c, 24d, and 24e, in the width direction has a forward tapered shape as described above, each of the second wiring lines 24a, 24b, 24c, 24d, and 24e, which are formed above the first wiring lines 22a, 22b, and 22c, is formed along the forward tapered shape of a corresponding one of the first wiring lines 22a, 22b, and 22c so as to be bent and define an obtuse angle. Consequently, thermal stress is dispersed in the second wiring lines, and thus, breakage of the second wiring lines is able to be reduced or prevented.

In addition, a material that has high ductility may be used as the material of the second wiring lines 24a, 24b, 24c, 24d, and 24e. In the case in which the second wiring lines 24a, 24b, 24c, 24d, and 24e are made of a ductile material, the second wiring lines 24a, 24b, 24c, 24d, and 24e will not break even if thermal stress is repeatedly applied thereto, and thus, breakage of bent portions of the second wiring lines 24a, 24b, 24c, 24d, and 24e due to the thermal stress is able to be reduced or prevented.

Next, solder-mounting pads that are used to solder-mount the mounting component 2 are formed on the first wiring lines 22a, 22b, and 22c and the second wiring lines 24a, 24b, 24c, 24d, and 24e. The solder-mounting pads are each preferably formed by an Au/Ni layer (not illustrated), for example, which is an under-bump metal layer for solder bonding, on the first wiring lines 22a, 22b, and 22c and the second wiring lines 24a, 24b, 24c, 24d, and 24e and by patterning the Au/Ni layer into a predetermined shape. In addition, an insulating film (not illustrated) that prevents solder from spreading out may be formed on the first wiring lines 22a, 22b, and 22c and the second wiring lines 24a, 24b, 24c, 24d, and 24e and on the resin structure 10.

Figure 4K:
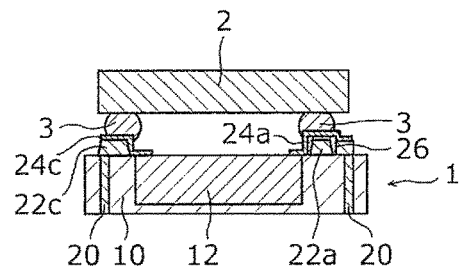
FIG. 4K is a sectional view illustrating the process of manufacturing the electronic component device according to the first preferred embodiment of the present invention.

Next, as illustrated in FIG. 4K, the mounting component 2 is mounted on the solder-mounting pads. The mounting component 2 is connected to the second wiring lines 24a, 24b, 24c, 24d, and 24e via bumps 3. Note that the mounting component 2 may be connected to the first wiring lines 22a, 22b, and 22c.

Figure 4L:
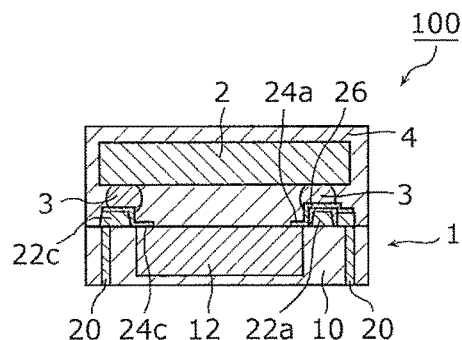
FIG. 4L is a sectional view illustrating the process of manufacturing the electronic component device according to the first preferred embodiment of the present invention.

Then, as illustrated in FIG. 4L, the sealing layer 4 is formed to seal the mounting component 2, which has been stacked on the solder-mounting pads. As a material of the sealing layer 4, a resin such as a polyimide resin, a benzocyclobutene resin, a polybenzoxazole resin, a phenolic resin, a silicone-based resin, or other suitable resin, for example, may preferably be used. The mounting component 2 is sealed on the electronic-component-embedded substrate 1 using at least one of these materials, so that manufacture of the electronic component device 100 is completed.

Figure 4M:
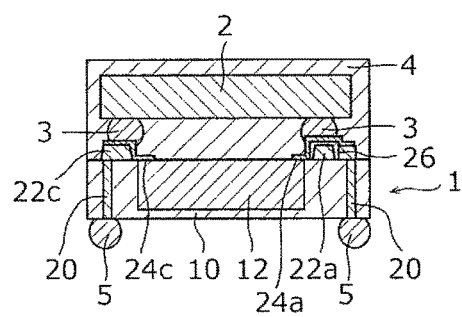
FIG. 4M is a sectional view illustrating the process of manufacturing the electronic component device according to the first preferred embodiment of the present invention.
Figure 4N:
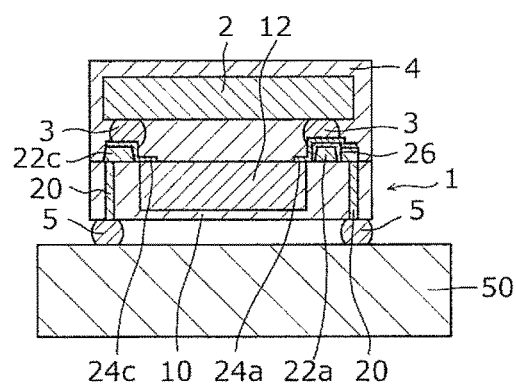
FIG. 4N is a sectional view illustrating the process of manufacturing the electronic component device according to the first preferred embodiment of the present invention.

Next, as illustrated in FIG. 4M, an under-bump metal layer (not illustrated) and solder balls 5 are formed on each of the through electrodes 20.

In addition, as illustrated in FIG. 4N, the plurality of electronic component devices 100, which have been simultaneously formed on the same resin structure 10, are singulated, and each of the electronic component devices 100 is mounted on a module substrate 50, which is a mounting substrate, via the solder balls 5.

In the manner described above, the electronic component device 100 having a multilayer structure including the electronic-component-embedded substrate 1, which includes the through electrodes 20, the electronic components 12 and 14, the first wiring lines 22a, 22b, and 22c, and the second wiring lines 24a, 24b, 24c, 24d, and 24e, and the mounting component 2, which is mounted on the electronic-component-embedded substrate 1, is able to be manufactured.

As described above, according to the electronic-component-embedded substrate 1, the electronic component device 100, and the method of manufacturing the electronic-component-embedded substrate 1 and the electronic component device 100 of the present preferred embodiment, the power-supplying metal layer 22 is patterned (rewired) as the first wiring lines 22a, 22b, and 22c, and thus, a process of manufacturing the wiring lines in the electronic-component-embedded substrate 1 is able to be simplified. In addition, since the through electrodes 20 are formed by the electrolytic plating method using the power-supplying metal layer 22, the power-supplying metal layer 22 and the through electrodes are able to be bonded together with high strength and low resistance. Consequently, the first wiring lines 22a, 22b, and 22c formed by patterning the power-supplying metal layer 22 and the through electrodes 20 are less likely to separate from one another, and favorable high-frequency transmission characteristics is able to be obtained. Therefore, the electronic-component-embedded substrate 1 and the electronic component device 100 in which separation of the wiring lines is less likely to occur are able to be provided.

In addition, by roughening the surface of the first wiring line 22a, the contact surface area between the wiring material and the interlayer insulating layer 26 is increased, and the degree of contact between the wiring material and the interlayer insulating layer 26 is improved by an anchor effect. As a result, the degree of contact between the first wiring line 22a and the interlayer insulating layer 26 is improved. Therefore, in the electronic-component-embedded substrate 1, separation of the first wiring line 22a and the interlayer insulating layer 26 from each other is able to be reduced or prevented.

Figure 5:
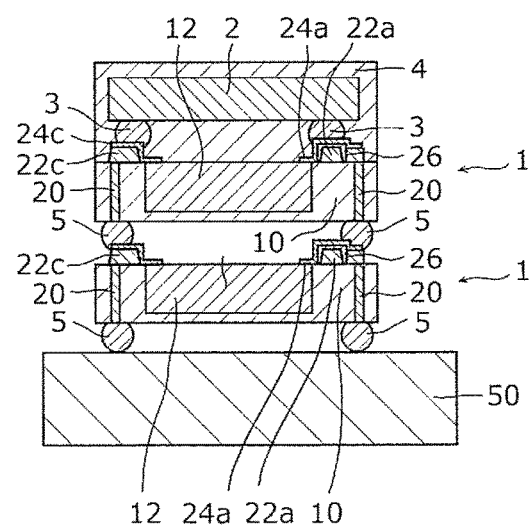
FIG. 5 is a sectional view illustrating another example of the electronic component device according to the first preferred embodiment of the present invention.

Note that the electronic component device 100 may have a configuration in which a plurality of electronic-component-embedded substrates 1 are laminated together between the mounting component 2 and the module substrate 50, which are illustrated in FIG. 4N. For example, as illustrated in FIG. 5, two electronic-component-embedded substrates 1 are laminated together between the mounting component 2 and the module substrate 50, and the mounting component 2, the two electronic-component-embedded substrates 1, and the module substrate 50 may be electrically connected to one another via the solder balls 5.

A modification of the first preferred embodiment will now be described. Note that, since the first wiring lines 22a, 22b, and 22c have the same or substantially the same configuration, the first wiring line 22a will be described below as an example. In addition, since the second wiring lines 24a, 24b, 24c, 24d, and 24e have the same or substantially the same configuration, the second wiring line 24a will be described below as an example.

To improve the degree of contact between the first wiring line 22a and the interlayer insulating layer 26, it is preferable to roughen the surface of the first wiring line 22a that is located on the side on which the interlayer insulating layer 26 is provided. In addition, in order to ensure the high-frequency transmission characteristics of the first wiring line 22a, by taking a skin effect into consideration, it is preferable to reduce the roughness of the surface of the first wiring line 22a that has a large wiring line width and that is located on the side on which the resin structure 10 is provided, the surface having a large influence on the high-frequency transmission characteristics. Thus, in the above-described electronic-component-embedded substrate 1, the surface of the first wiring line 22a that is located on the side on which the interlayer insulating layer 26 is provided may be roughened more than the surface of the first wiring line 22a that is located on the side on which the resin structure 10 is provided.

Figure 6:
FIG. 6 is a schematic cross-sectional view illustrating the cross-sectional shape of a first wiring line of an electronic component device according to a modification of the first preferred embodiment of the present invention in a width direction of the first wiring line.

As illustrated in FIG. 6, the first wiring line 22a includes surfaces that are roughened more than the surfaces of the second wiring line 24a illustrated in FIG. 3B. For example, the first wiring line 22a is formed by patterning the power-supplying metal layer 22, which is in the form of foil, as described above. Thus, in the manufacturing process, the two surfaces of the power-supplying metal layer 22 may be roughened before the power-supplying metal layer 22 is disposed on the resin structure 10 in order to improve the degree of contact between the power-supplying metal layer 22 and the resin structure 10. As a result, the degree of contact between the first wiring line 22a and the interlayer insulating layer 26 is improved, and in addition, the degree of contact between the first wiring line 22a and the resin structure is improved. Therefore, the electronic-component-embedded substrate and the like in which separation of the wiring lines is further less likely to occur is able to be provided.

Note that a configuration may be provided in which the surface of the first wiring line 22a that is brought into contact with the interlayer insulating layer 26 or the surface of the first wiring line 22a that is brought into contact with the resin structure 10 is not roughened. In this case, deterioration of the high-frequency transmission characteristics of the first wiring line 22a is able to be reduced or prevented.

Second Preferred Embodiment

Figure 7:
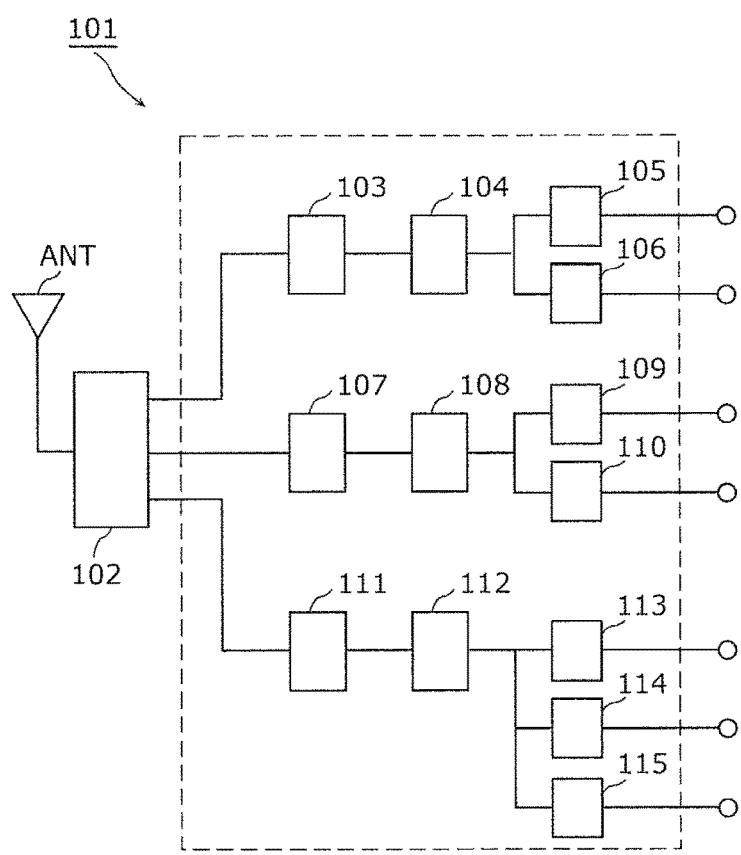
FIG. 7 is a circuit diagram illustrating an example of a communication module according to a second preferred embodiment of the present invention.

A second preferred embodiment of the present invention will be described with reference to FIG. 7. FIG. 7 is a circuit diagram illustrating an example of a communication module 101 according to the present preferred embodiment.

The electronic-component-embedded substrate 1 and the electronic component device 100, which have been described above in the first preferred embodiment and the modification, may be used as the electronic-component-embedded substrate 1 and the electronic component device 100 that are included in the communication module 101.

As illustrated in FIG. 7, in the communication module 101, a multiplexer 102 is connected to an antenna ANT. Couplers 103, 107, and 111 are connected to the multiplexer 102. Duplexers 105 and 106 are connected to the coupler 103 via a switch 104. Duplexers 109 and 110 are connected to the coupler 107 via a switch 108. A duplexer 113 and surface acoustic wave filters 114 and 115 are connected to the coupler 111 via a switch 112.

The communication module 101 is preferably, for example, an RF module that is used in a cellular phone or other suitable device, for example. The above-described electronic component device 100 is able to be preferably used in such a communication module that includes a large number of switches, duplexers, filters, and so forth.

Although the methods of manufacturing electronic-component-embedded substrates, the electronic-component-embedded substrates, the electronic component devices, and the communication modules according to the preferred embodiments of the present invention have been described above, the methods of manufacturing electronic-component-embedded substrates, the electronic-component-embedded substrates, the electronic component devices, and the communication modules according to the present invention are not limited to the above-described preferred embodiments. Other preferred embodiments that are obtained by combining arbitrary components of the above-described preferred embodiments, modifications that are obtained by making various modifications devised by those skilled in the art to the above-described preferred embodiments within the gist of the present invention, various devices in each of which the electronic-component-embedded substrates, the electronic component devices, and the communication modules, which have been described above, are embedded and manufacturing methods including the above-described methods of manufacturing electronic-component-embedded substrates are also included in the scope of the present invention.

For example, in the component-embedded substrates according to the above-described preferred embodiments, the electronic components may be high-frequency circuit components, such as filters, or electronic components, such as inductors or capacitors. In addition, as high-frequency circuit components, electronic components such as acoustic wave filters, piezoelectric resonators, and multilayer capacitors or module components may be used.

Furthermore, the resin structure may be made of a synthetic resin, such as an epoxy resin, for example, or an acrylic resin or may be made of a resin material obtained by adding an inorganic filler such as silica or alumina, for example, to a synthetic resin, such as an epoxy resin, for example.

The power-supplying metal layer, the first wiring lines, the second wiring lines, and the through electrodes may be made of a metal, such as copper or an alloy. The first wiring lines, the second wiring lines, and the through electrodes may be made of the same or substantially the same material or may be made of different materials. In addition, the power-supplying metal layer of the first wiring lines may be made of foil.

The interlayer insulating layer may be made of, for example, a resin such as a polyimide resin, a benzocyclobutene resin, a polybenzoxazole resin, a phenolic resin, a silicone-based resin, or other suitable resin and is not limited to being made of these resins. The interlayer insulating layer may be made of a different resin or a material having an insulating property.

The angle of each of the side surfaces of the first wiring lines with respect to the surface of the resin structure may be suitably changed as long as the cross-sectional shape of each of the first wiring lines in the line-width direction is a tapered shape.

Preferred embodiments of the present invention may be applied to a communication module that includes a switch, a duplexer, a filter, and other components, and in which an electronic component is embedded, and an example of such a communication module is an RF module that is used in a cellular phone or other suitable device, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic-component-embedded substrate comprising:
   an electronic component;
   a resin structure in which the electronic component is embedded, and a main surface of the electronic component is exposed;
   a through electrode extending through two surfaces of the resin structure;
   a first wiring line provided on a surface of the resin structure and connected to the through electrode;
   an insulating layer disposed at a position at which the insulating layer covers a portion of the first wiring line; and
   a second wiring line provided above the first wiring line and the insulating layer so as to cross at least a portion of the first wiring line; wherein
   a surface of the first wiring line that is located on an insulating layer side is roughened; and
   the second wiring line has a ductility higher than a ductility of the first wiring line.

2. An electronic component device comprising:
   a mounting substrate;
   the electronic-component-embedded substrate according to claim 1 mounted on the mounting substrate; and
   a mounting component that is mounted on the electronic-component-embedded substrate.

3. The electronic component device according to claim 2, wherein the electronic component device includes a plurality of the electronic-component-embedded substrates laminated together between the mounting substrate and the mounting component.

4. A communication module comprising:
   a high-frequency device including the electronic component device according to claim 2.

5. The communication module according to claim 4, wherein the electronic component device includes a plurality of the electronic-component-embedded substrates laminated together between the mounting substrate and the mounting component.

6. An electronic-component-embedded substrate comprising:
    an electronic component;
    a resin structure in which the electronic component is embedded, and a main surface of the electronic component is exposed;
    a through electrode extending through two surfaces of the resin structure;
    a first wiring line provided on a surface of the resin structure and connected to the through electrode;
    an insulating layer disposed at a position at which the insulating layer covers a portion of the first wiring line; and
    a second wiring line provided above the first wiring line and the insulating layer so as to cross at least a portion of the first wiring line; wherein
    a surface of the first wiring line that is located on an insulating layer side is roughened; and
    an angle of a side surface of the first wiring line with respect to the surface of the resin structure that is in contact with the first wiring line is an angle at which a line width of a surface of the first wiring line that is located on a resin structure side is larger than a line width of a surface of the first wiring line that is located on the insulating layer side.

7. An electronic component device comprising:
    a mounting substrate;
    the electronic-component-embedded substrate according to claim 6 mounted on the mounting substrate; and
    a mounting component that is mounted on the electronic-component-embedded substrate.

8. The electronic component device according to claim 7, wherein the electronic component device includes a plurality of the electronic-component-embedded substrates laminated together between the mounting substrate and the mounting component.

9. A communication module comprising:
    a high-frequency device including the electronic component device according to claim 7.

10. The communication module according to claim 9, wherein the electronic component device includes a plurality of the electronic-component-embedded substrates laminated together between the mounting substrate and the mounting component.

11. An electronic-component-embedded substrate comprising:
    an electronic component;
    a resin structure in which the electronic component is embedded, and a main surface of the electronic component is exposed;
    a through electrode extending through two surfaces of the resin structure;
    a first wiring line provided on a surface of the resin structure and connected to the through electrode;
    an insulating layer disposed at a position at which the insulating layer covers a portion of the first wiring line; and
    a second wiring line provided above the first wiring line and the insulating layer so as to cross at least a portion of the first wiring line; wherein
    a surface of the first wiring line that is located on an insulating layer side is roughened; and
    in at least one position at which the first wiring line and the second wiring line cross each other, cross-sectional shapes of the first wiring line and the second wiring line in a line-width direction are shapes with which a ratio of a difference between a line width of a surface of the first wiring line that is located on a resin structure side and a line width of a surface of the first wiring line that is located on the insulating layer side to a thickness of the first wiring line is larger than a ratio of a difference between a line width of a surface of the second wiring line that is located on the resin structure side and a line width of a surface of the second wiring line that is located on the insulating layer side to a thickness of the second wiring line.

12. An electronic component device comprising:
    a mounting substrate;
    the electronic-component-embedded substrate according to claim 11 mounted on the mounting substrate; and
    a mounting component that is mounted on the electronic-component-embedded substrate.

13. The electronic component device according to claim 12, wherein the electronic component device includes a plurality of the electronic-component-embedded substrates laminated together between the mounting substrate and the mounting component.

14. A communication module comprising:
    a high-frequency device including the electronic component device according to claim 12.

15. The communication module according to claim 14, wherein the electronic component device includes a plurality of the electronic-component-embedded substrates laminated together between the mounting substrate and the mounting component.

16. An electronic-component-embedded substrate comprising:
    an electronic component;
    a resin structure in which the electronic component is embedded, and a main surface of the electronic component is exposed;
    a through electrode extending through two surfaces of the resin structure;
    a first wiring line provided on a surface of the resin structure and connected to the through electrode;
    an insulating layer disposed at a position at which the insulating layer covers a portion of the first wiring line; and
    a second wiring line provided above the first wiring line and the insulating layer so as to cross at least a portion of the first wiring line; wherein
    a surface of the first wiring line that is located on an insulating layer side is roughened; and
    the surface of the first wiring line that is located on the insulating layer side is roughened more than the surface of the first wiring line that is located on a resin structure side.

17. An electronic component device comprising:
    a mounting substrate;
    the electronic-component-embedded substrate according to claim 16 mounted on the mounting substrate; and
    a mounting component that is mounted on the electronic-component-embedded substrate.

18. The electronic component device according to claim 17, wherein the electronic component device includes a plurality of the electronic-component-embedded substrates laminated together between the mounting substrate and the mounting component.

19. A communication module comprising:
    a high-frequency device including the electronic component device according to claim 17.

20. The communication module according to claim 19, wherein the electronic component device includes a plurality of the electronic-component-embedded substrates laminated together between the mounting substrate and the mounting component.

\* \* \* \* \*